(12) United States Patent
Vickram et al.

(10) Patent No.: US 6,894,567 B2
(45) Date of Patent: May 17, 2005

(54) ESD PROTECTION CIRCUIT FOR USE IN RF CMOS IC DESIGN

(75) Inventors: Vathulya Vickram, Ossining, NY (US); Govil Alok, Sleepy Hollow, NY (US); Sowlati Tirdad, Ossining, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 449 days.

(21) Appl. No.: 10/011,986

(22) Filed: Dec. 4, 2001

(65) Prior Publication Data

US 2003/0102923 A1 Jun. 5, 2003

(51) Int. Cl.⁷ .............................. H02H 7/20; H03K 5/08
(52) U.S. Cl. ....................................... 330/298; 327/314
(58) Field of Search ................................. 330/298, 277, 330/292; 327/314

(56) References Cited

U.S. PATENT DOCUMENTS

| | | | | |
|---|---|---|---|---|
| 5,276,370 A | * | 1/1994 | Nishiura et al. ............ 327/109 |
| 5,393,991 A | * | 2/1995 | Kawakami .................... 257/48 |
| 5,740,000 A | * | 4/1998 | Stackhouse et al. .......... 361/56 |
| 5,969,929 A | * | 10/1999 | Kleveland et al. .......... 361/111 |
| 5,973,897 A | | 10/1999 | Opris et al. .................... 361/56 |
| 6,291,964 B1 | | 9/2001 | Chen et al. .................... 320/56 |
| 6,400,204 B1 | * | 6/2002 | Davis ......................... 327/314 |
| 2001/0015881 A1 | | 8/2001 | Takikawa et al. ............. 361/56 |

* cited by examiner

*Primary Examiner*—Patricia Nguyen
(74) *Attorney, Agent, or Firm*—Peter Zawilski

(57) ABSTRACT

An improved method is presented for adding ESD protection to large signal MOS circuits. Each of the ESD and the MOS devices are separately connected off chip to rigid voltage points, thereby eliminating additional capacitive loading of MOS devices.

An improved RF MOS amplifier is presented which implements the method of the invention. An ESD device, comprising back to back diodes, is connected to the Vdd and GND nodes off chip, thus insulating the amplifying transistor from any performance degradative interaction with the ESD device due to transient forward biasing.

The method and apparatus are easily extended to circuits comprising any number of MOS devices.

8 Claims, 4 Drawing Sheets

ESD PROTECTION CIRCUIT FOR USE IN RF CMOS IC DESIGN

TECHNICAL FIELD

The present invention relates to power amplifiers, and more specifically, to an improved configuration for power amplifiers suitable for use in high-frequency applications.

BACKGROUND OF THE INVENTION

Electrostatic discharge ("ESD") is the principal cause of damage to integrated circuits. Presently, semiconductor circuits, such as, for example, CMOS amplifiers and digital circuits, often utilize on-chip ESD protection devices comprising of diodes added to the circuit. Typically, these protection circuits comprise diodes added in a back to back configuration, which divert the charge away from vulnerable circuit nodes, such as, for example, signal inputs to the CMOS gates.

This conventional method of providing ESD protection can be theoretically ported to large signal circuits. In particular, such ESD protection schemes may be used to protect the gate of a metal oxide semiconductor field-effect transistor ("RF MOSFET") power amplifier in a RF application. In such a scheme, back to back diodes are connected between the gate node and the Vdd and Vgg (i.e., GND) nodes of the MOS transistors. The drain and source nodes of the transistors themselves are generally connected to the voltage rail nodes as well. Thus, for each transistor, one diode is connected on-chip between the gate and drain of the MOS device that it is protecting, while a second diode is connected on-chip between the gate and the source of the same MOS device. The Vdd/Vgg nodes of the MOS and the ESD devices are thus connected on chip.

When electrostatic charge appears with respect to the drain or the source, the two diodes conduct in the forward/reverse mode depending on the polarity of the electrostatic charge, thereby diverting it away from the MOS gates.

As an added protective measure, a resistive feed can also be used for biasing the input gates of the MOS device. Such a resistor provides additional protection against ESD by dropping voltage across the resistor.

However, using these conventional techniques, the diodes will have a parasitic capacitive loading effect at the MOS gate and, possibly, the drain/source nodes, resulting in RF performance degradation of the amplifier. For small signal amplifiers, this added parasitic capacitance will be a constant, non temporally variant load. While such constant load does result in performance degradation, it does not introduce any non-linearity. Therefore, the added parasitic capacitance may be tolerable for small signal applications.

In the case of large signal power amplifiers however, significant voltage swings at the drain (for n-MOS transistors) can occur, going from zero to twice the amplifier's supply voltage, i.e., from zero to 2*Vdd. This is due to the nature of the inductive feed to the drain of the amplifying transistor. Simultaneously, the gate voltage can swing out of phase with the drain waveform. If this constellation of events occurs, in the worst case scenario the drain node can have a large negative voltage and the gate node its peak positive voltage. In such eventuality the diode across the gate and drain would be forward biased, resulting in the clipping of the gate voltage to the forward drop of the diode and cause distortion in the power amplifier. Even if the voltage swings do not occur, the reverse bias of the two diodes will change drastically with time. Consequently, the parasitic capacitance load will change non-linearly, introducing significant distortion in the power amplifier. As a result, the conventional ESD protection configuration cannot be justified for power amplifier circuits.

What is needed therefore is a power amplifier circuit with ESD protection that does not introduce additional parasitic capacitance.

It is an object of the present invention to present a method of ESD protection that minimizes or obviates the introduction of additional parasitic capacitance.

It is a further object of the present invention to provide a power amplifier circuit that incorporates an ESD protection device while minimizing or avoiding additional parasitic capacitive loading.

SUMMARY OF THE INVENTION

An improved method is presented for adding ESD protection to large signal MOS circuits. Each of the ESD and the MOS devices are separately connected off chip to rigid voltage points, thereby eliminating additional capacitive loading of MOS devices.

An improved RF MOS amplifier is presented which implements the method of the invention. An ESD device, comprising back to back diodes, is connected to the Vdd and GND nodes off chip, thus insulating the amplifying transistor from any performance degradative interaction with the ESD device due to transient forward biasing.

The method and apparatus are easily extended to circuits comprising any number of MOS devices.

BRIEF DESCRIPTION OF THE DRAWINGS

The present invention may be more clearly understood with reference to the following description, to be read in conjunction with the accompanying drawings.

DETAILED DESCRIPTION OF THE DRAWINGS

Figure 1:
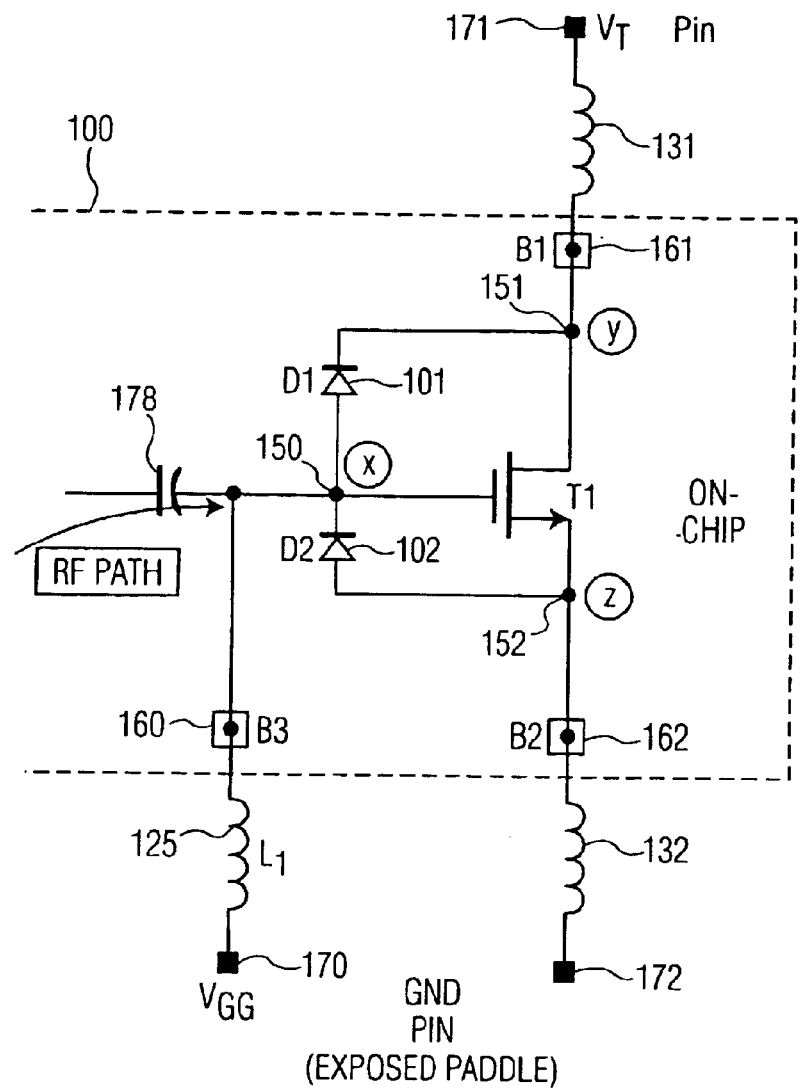
FIG. 1 depicts a single transistor power amplifier configuration implementing a conventional ESD protection technique.

FIG. 1 shows a conventional method of protecting a MOSFET from an ESD event. Because the invention improves upon this structure, yet shares most circuit elements with it, it will first be described in detail, and the modifications according to the present invention then discussed.

With reference to FIG. 1, as well as all of the figures herein, the area within the dashed line 100 is the portion of the circuit which is on-chip. An ESD device is utilized, comprised of back to back diodes for each MOS device. Diodes D1 101 and D2 102 are positioned back to back from the ground rail 162 to the transistor's gate 150 (also indicated as point "X" in the figure) and from the gate 150 to the Vdd rail 161, respectively. One end of diode D1 101 is connected on-chip to the drain node 151 (also indicated as point "Y" in the figure) of the MOS device it is protecting, while diode D2 102 is connected on-chip to the source node 152 (also indicated as point "Z" in the figure) of the MOS device.

The drain node 151 is connected to bondpad B1 161, and through a bondwire 131 to the Vdd pin 171 of the package. This Vdd pin could be a single pin for the whole integrated circuit package, or the package might be arranged to have one Vdd pin for each stage of the amplifier. The source of the MOS device 152 is connected to bondpad B2 162, which is in turn connected, via bondwire 132, to the exposed ground paddle 172 (GND) of the IC package.

An inductor L1 125 is used to bias the gate node 150, of the MOS device. In some cases, this inductor is used as an impedance matching element to a previous stage of the amplifier. The inductor is connected between Vgg 170 and bondpad B3 160.

When electrostatic charge appears on the Vgg pin 170 with respect to the Vdd pin 171 or the GND pin 172, the diodes D1 101 and D2 102 start conducting in a forward or reverse mode, depending on the polarity of the electrostatic charge. For example, due to a voltage rise from the electrostatic charge at node X 150, diode D1 101 will begin conducting in the forward direction, thereby diverting a positive voltage spike away from the MOS gate and preventing oxide breakdown and consequent damage to the transistor. In the event of a negative voltage spike, diode D2 102 will conduct in the forward direction from the GND node 172 to node X 150, thereby diverting charge due to a negative voltage spike. Obviously, the diodes used in such an ESD application would need to be designed to have forward/reverse conduction voltages that are less than the oxide breakdown voltage value, in order to permit the conduction away from the gate 150.

Figure 2:
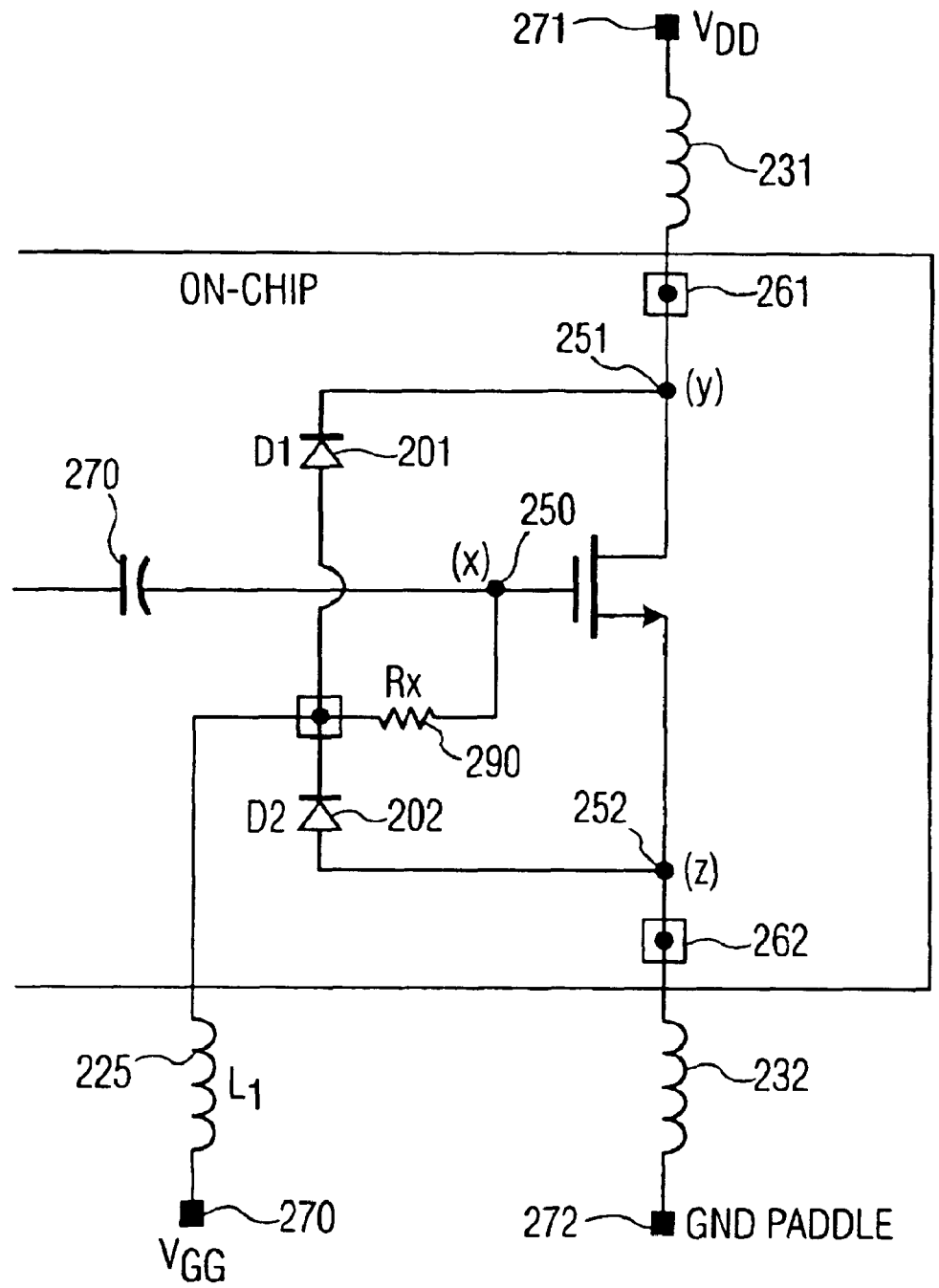
FIG. 2 depicts the circuit of FIG. 1 with the gate of the MOS device resistively biased.

FIG. 2 shows a similar configuration as depicted in FIG. 1, but with a resistor Rx 290 added at the gate. The other nodes and components of the circuit depicted in FIG. 2 are identical to those depicted in FIG. 1; thus, they are labeled with index numbers identical in the tens and units places to those in FIG. 1 and, for brevity, will not be discussed further. This resistor 290 provides additional protection for the gate 250 against ESD by dropping voltage across such resistor 290, thereby reducing the current flow to the gate 250 in the event of a voltage spike at Vgg 270. The circuit type of FIG. 2, with a resistor between the RF signal and the MOS gate, is utilized when the circuit is not the very first amplifier input stage, inasmuch as at the first input stage the gate has to have a direct connection to the outside RF input, and an inductive bias must be used.

So far so good. However, in each of the circuits depicted in FIG. 1 and FIG. 2, the diodes D1 101,201 and D2 201,202 are connected on chip to nodes Y 151,251 and Z 152, 252. Thus, these diodes will introduce a parasitic capacitive load at the gate, drain, and source nodes in the circuit of FIG. 1, and at the drain and source nodes in the circuit of FIG. 2. For small signal amplifiers, the instantaneous reverse bias across the diodes in the active mode of amplifier operation will be a constant value, close to the DC bias settings for the amplifier. These reverse bias values will thus be approximately Vdd–Vgg for D1 101, 201, and Vgg–GND=Vgg for D2 102, 202. Thus, the parasitic capacitance at the affected nodes X or Y/Z will be a constant load, invariant with time. This constant load will degrade the amplifier performance, as described aboe, but it will not introducenon-linerity.

However, for large signal amplifiers, the drain node Y of the MOS device can have voltage swings that go from zero to twice the supply voltage for the amplifier. Simultaneously, the gate voltage may swing out of phase (~180 degrees) with the drain waveform. These voltage swings may result in a situation where the diode D1 can actually become forward biased. This will result in the clipping of the gate voltage to the forward drop of the diode and cause distortion in the power amplifier.

Even if this forward biasing of diode D1 101, 201 does not occur, diodes D1 101, 201 and D2 102, 202 will have reverse biases that vary drastically with time. This will change the parasitic capacitive load at the gate, drain, and source nodes in a non-linear fashion, introducing further distortion in the power amplifier. Thus, conventional techniques for providing ESD protection cannot be justified in large signal amplification applications due to this distortion.

Figure 3:
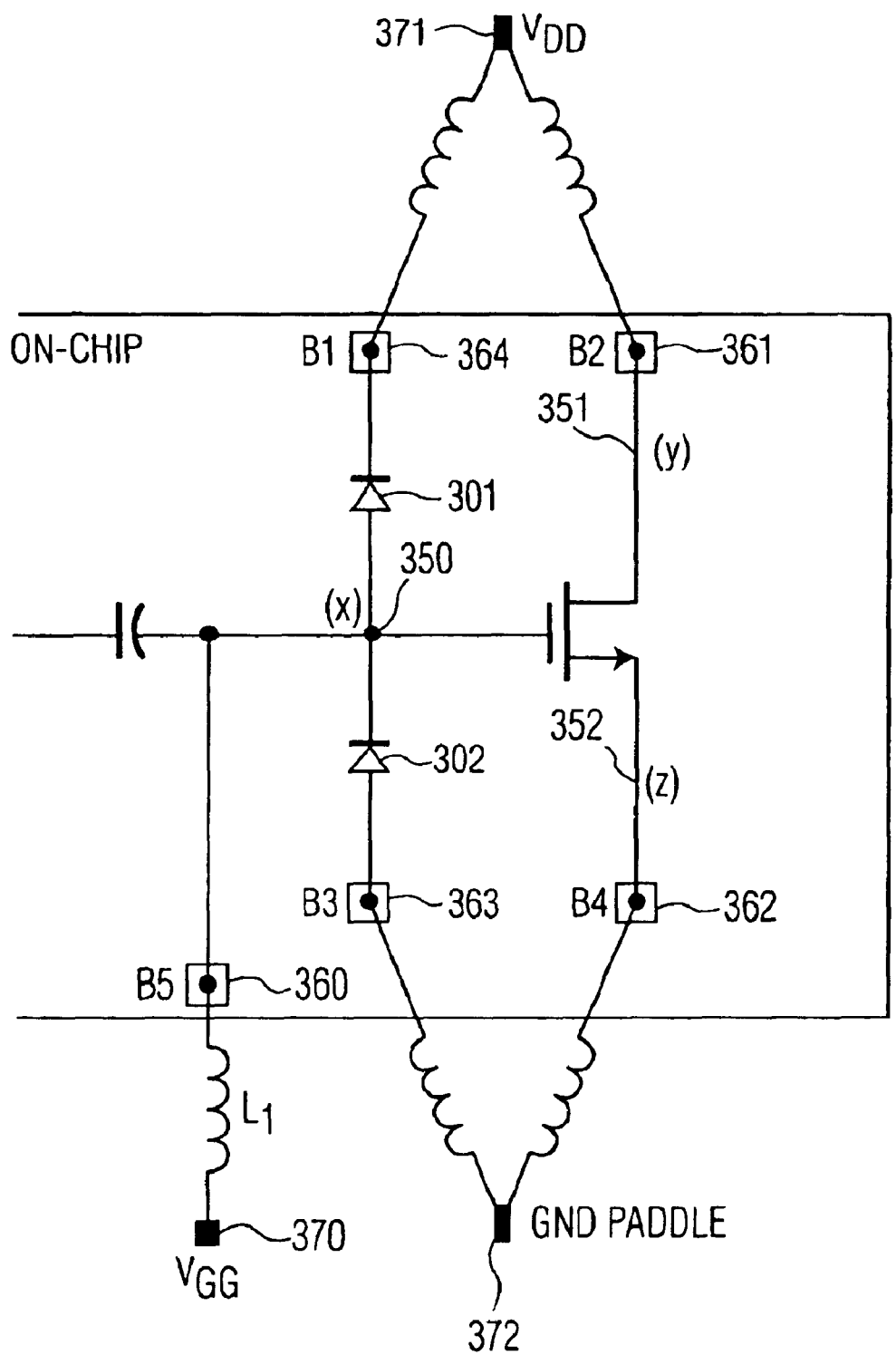
FIG. 3 depicts the circuit of FIG. 1 according to the present invention.
Figure 4:
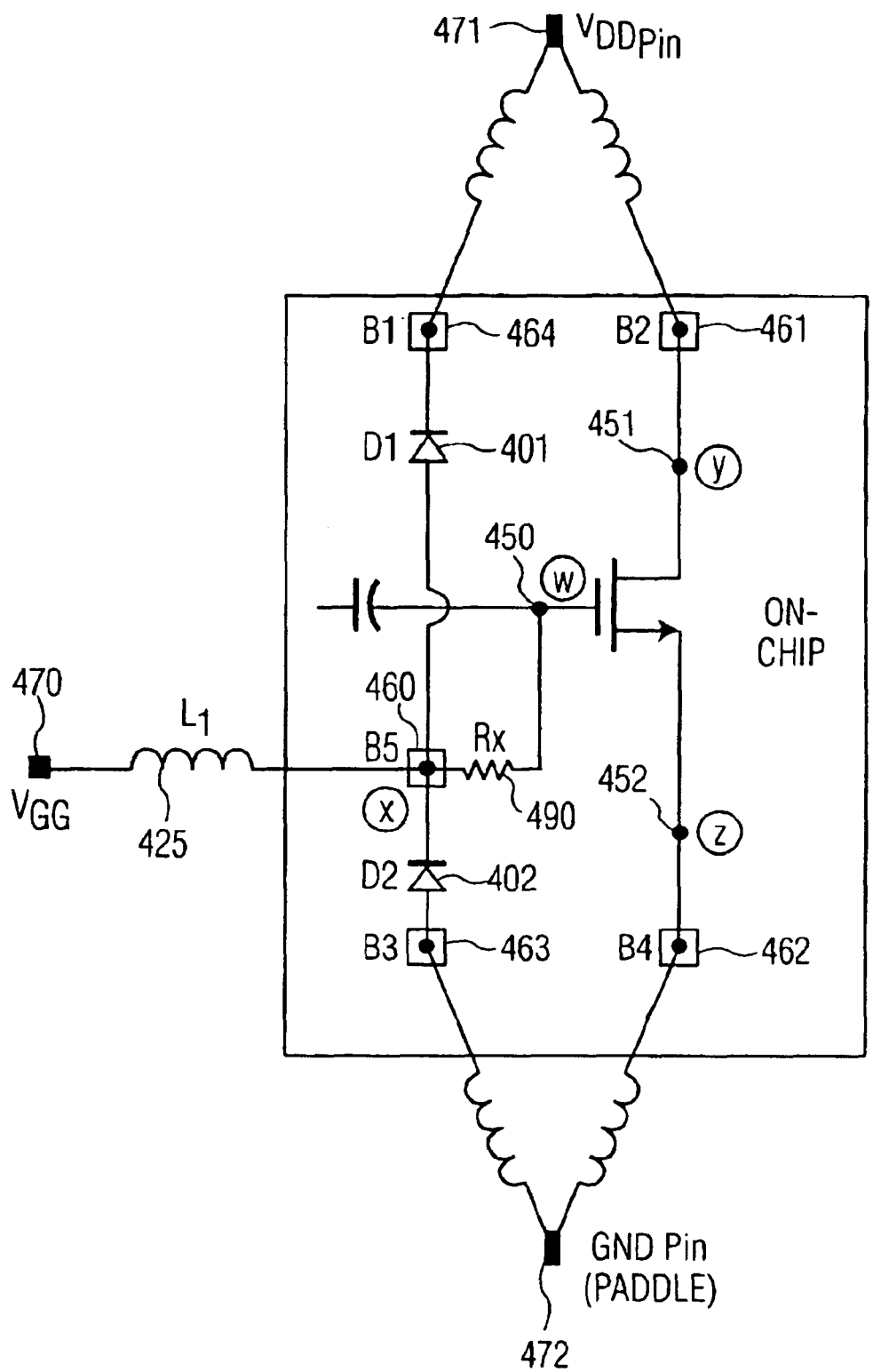
FIG. 4 depicts the circuit of FIG. 2 according to the method of the present invention.

The method of the present invention cures this distortion problem by separating the diodes from the drain and source nodes of the amplifier. FIGS. 3 and 4 depict the circuits of FIGS. 1 and 2, respectively, as modified by the improved method of the present invention. The circuits of FIGS. 3 and 4 are identical to those of FIGS. 1 and 2, respectively, except as specifically noted.

FIG. 3 depicts a configuration in accordance with the method of the present invention. In this circuit, the ESD device comprising diodes D1 301 and D2 302 connected to bondpad B1 364 and bondpad B3 363, which are the new circuit components, and the MOS device is taken to bondpad B2 361 and bondpad B4 362. As shown in FIG. 3, bondwires are used to connect B1 364 and B2 361 to the Vdd paddle, and to connect B3 363 and B4 362 to the GND pin.

The resulting pin inductance, as compared to the designed drain inductance, from the added pins may be minimized by various means as is well known in the art. For example, an off-chip capacitor may be placed on the printed circuit board ("PCB") to cancel the effect of the pin inductance.

In the embodiment shown in FIG. 3, the top connection of diode D1 301, i.e., to bondpad B1 364 is now taken to a rigid voltage point, and the bottom connection of diode D2 302, i.e. to bondpad B3 363 is also taken to a rigid voltage point. Thus, these circuit nodes are immune to any large voltage swings that would occur in the configuration of FIG. 1. This novel technique eliminates the possibility of diode D1 301 becoming forward biased under RF operation, leading to diode clipping induced harmonic distortion.

Instantaneous voltage swings will still occur at the gate node X 350, due to the electrostatic charge. However, because the diodes are connected to rigid voltage points, the variations in the capacitive loading effects at node X 350 is significantly reduced from the circuit configuration depicted in FIG. 1. As a result, the overall performance degradation is greatly reduced compared to the prior art technique of applying a conventional ESD protection device, with on-chip connections, to a transistor circuit.

Inasmuch as FIG. 3 depicts a configuration used for the very first input stage. The gate thus requires a direct connection to the outside world for the RF input, and a resistor Rx cannot be placed in the RF path. In addition, a resistor cannot be used if the bias feed for the MOS gate must be an inductor L1 which is required for interstage matching. When these considerations do not apply, the circuit of FIG. 4 can be used.

FIG. 4 depicts the method of the present invention applied to the resistive biasing circuit of FIG. 2, as above, used where the MOS device is not the very first input stage or is not a stage where an inductive bias feed is required. In such case, a resistor Rx 490 can be added to the bias path to the gate. The resistor Rx 490, again, provides further protection against ESD by dropping voltage across the resistor, thereby reducing current flow to the MOS gate.

Directly analogously to the circuit of FIG. 3, the back to back diode configuration of diodes D1 401 and D2 402 are respectively connected to two nodes which are rigid DC nodes in RF operation. Therefore, the reverse bias on the diodes will remain constant under RF operation, and the large voltage swings in RF operation will be eliminated.

The configuration depicted in FIG. 4 achieves the optimal combination of ESD protection and negligible influence on RF performance, wherein the diodes are connected to rigid voltage nodes and the MOS gate is resistively biased. However, the configuration shown in FIG. 3, without the added resistor Rx in the gate bias path, also provides significant benefits in terms of minimization of non-linear performance degradation.

The present invention will provide a significant improvement to any application where large signal amplification needs to be accomplished. Some, but clearly not all, of such applications including all mobile telecommunications and all wireless LAN applications, inasmuch as these applications involve the propagation of significantly amplified—so as to be strong enough to travel through the air and reach the receiver in sufficient strength—signals.

It is understood that while the foregoing describes the preferred embodiments of the invention, various other modifications and additions will be apparent to those of skill in the art, such as the application of the techniques of the invention to multitransistor amplifier stages, as well as other circuits, such as digital, waveform generation, etc. that comprise transistors or the equivalent. While the design is eminently useful in large signal amplification applications, where the signal swings cause significant nonlinearities, the invention can also be applied to small signal applications, and thus obviate the ESD device capacitively loading (albeit linearly) the amplifying transistor. The above described design may also be applied in various other technologies, both now known and to be known in the future. Different types of transistors or other components may be employed, and alterations to the circuit configuration may be made to suit particular design requirements.

What is claimed is:

1. A method of providing electrostatic discharge protection to a transistor circuit while minimizing additional parasitic capacitance comprising:
    adding diodes to the circuit, the circuit comprising one or more MOS transistors,
        wherein the diodes are added in such configuration so as to provide parallel paths to the voltage supply and ground nodes to protect active components;
        wherein for each transistor, the diodes are connected back to back, from the around node to the gate, and from the gate to the supply voltage node, connecting the diodes to rigid voltage points;
    a gate of each transistor is biased by a resistance in such a manner as to provide additional protection against electrostatic discharge and minimize additional parasitic capacitance; and
    the diodes are connected back to back, from the ground node to the resistance, and from the resistance to the supply voltage node.

2. The method of claim 1 wherein the diodes are connected on-chip to bondpads, and the bondpads are connected off chip to the supply and ground voltages.

3. The method of claim 1, wherein the diodes are connected on-chip to bondpads, and the bondpads are connected off chip to the supply and ground voltages.

4. A circuit, comprising:
    at least one MOS transistor;
    an electrostatic discharge protection device for each transistor, comprising a first diode and a second diode connected to rigid voltage points;
    wherein the diodes are added in such a configuration as to provide parallel paths to voltage supply and ground nodes;
        wherein the diodes are connected back to back, from the ground node to the gate, and from the gate to the supply voltage node of the circuit; and
    a resistance biasing a gate of the transistor, wherein the diodes are connected back to back, from the ground node to the resistance, and from the resistance to the supply voltage node of the circuit.

5. The transistor circuit of claim 4, wherein the diodes are connected to rigid voltage points, outside of an integrated circuit packaging containing the transistor circuit, via on-chip bondpads.

6. The transistor circuit of claim 4, wherein the transistor circuit comprises a portion of an amplifier circuit.

7. The transistor circuit of claim 4, wherein the diodes are connected to rigid voltage points, outside of an integrated circuit packaging containing the transistor circuit, via on-chip bondpads.

8. The transistor circuit of claim 7, wherein the transistor circuit comprises a portion of an amplifier circuit.

* * * * *